(12) United States Patent
Rana (10) Patent No.: US 8,750,049 B2
(45) Date of Patent: Jun. 10, 2014

(54) WORD LINE DRIVER FOR MEMORY

(75) Inventor: Vikas Rana, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 373 days.

(21) Appl. No.: 12/840,660

(22) Filed: Jul. 21, 2010

(65) Prior Publication Data

US 2011/0299355 A1    Dec. 8, 2011

(30) Foreign Application Priority Data

Jun. 2, 2010    (IN) .......................... 1282/DEL/2010

(51) Int. Cl.
*G11C 11/4193*    (2006.01)
*G11C 11/4195*    (2006.01)

(52) U.S. Cl.
USPC ................................. 365/185.23; 365/230.06

(58) Field of Classification Search
USPC ....................................... 365/230.06, 185.23
See application file for complete search history.

(56) References Cited

U.S. PATENT DOCUMENTS

| | | | |
|---|---|---|---|
| 5,245,571 A * | 9/1993 | Takahashi ................ | 365/185.05 |
| 5,265,052 A | 11/1993 | D'Arrigo et al. | |
| 5,282,176 A | 1/1994 | Allen et al. | |
| 5,513,137 A * | 4/1996 | Lee et al. ................. | 365/185.09 |
| 5,598,368 A | 1/1997 | Takahashi et al. | |
| 5,668,758 A | 9/1997 | Yiu et al. | |
| 5,761,123 A * | 6/1998 | Kim et al. ................ | 365/185.21 |
| 5,973,963 A * | 10/1999 | Sugawara ................ | 365/185.23 |
| 6,185,719 B1 * | 2/2001 | Sako .............................. | 716/104 |
| 6,255,860 B1 * | 7/2001 | Chavez et al. ................... | 327/20 |
| 6,373,780 B1 * | 4/2002 | Micheloni et al. ....... | 365/230.06 |
| 6,535,430 B2 | 3/2003 | Ogura et al. | |
| 6,868,009 B1 | 3/2005 | Hung et al. | |
| 7,046,577 B2 | 5/2006 | Leconte et al. | |
| 2002/0021584 A1 * | 2/2002 | Campardo et al. ....... | 365/185.23 |
| 2007/0279999 A1 * | 12/2007 | Watanabe et al. ........ | 365/185.23 |
| 2008/0049277 A1 * | 2/2008 | Usui ............................. | 358/534 |

* cited by examiner

*Primary Examiner* — Huan Hoang
*Assistant Examiner* — Jay Radke
(74) *Attorney, Agent, or Firm* — Hogan Lovells US LLP (57) ABSTRACT

A word-line driver includes first, second and third transistors. The first transistor includes a gate terminal driven by a first group selection signal, a first conduction terminal driven by a second sub-group selection signal and a second conduction terminal coupled to the word-line. The second transistor includes a gate terminal driven by a second group selection signal, a second conduction terminal driven by the second sub-group selection signal, and a first conduction terminal coupled to the word-line. The third transistor includes a gate terminal driven by a third the group selection signal, a first conduction terminal driven by a first sub-group selection signal, and a second conduction terminal coupled to the word-line.

10 Claims, 8 Drawing Sheets

WORD LINE DRIVER FOR MEMORY

RELATED APPLICATION

The present application claims priority of Indian Patent Application No. 1282/DEL/2010 filed Jun. 2, 2010, which is incorporated herein in its entirety by this reference.

TECHNICAL FIELD

The present subject matter relates, in general, to semiconductor memory design and, in particular, to a word-line driver for a memory.

BACKGROUND

Typically, a memory, such as a non-volatile memory, includes multiple memory cells arranged in the form of groups. Each group is connected to a corresponding word-line. The length of the word-line may vary depending on the memory array size and the technology used. As a result, a longer word-line may unnecessarily load its corresponding word-line decoder. In such cases, a word-line driver is used to drive the word-line.

The word-line driver is coupled, on one end, to a word-line decoder output, and on the other end, to a word-line. When the non-volatile memory is in an active mode, i.e., ready for being actively read or written, the word-line driver functions as a regular driver, following the word-line decoder, and providing a current source to pull up the word-line to a high voltage when the word-line is selected, and pull down the word-line to a low voltage when the word-line is not selected. When the non-volatile memory is in a standby mode, i.e., the memory cannot be actively read or written, and the power consumption is maintained at a level sufficient to retain the information stored in the memory cell arrays, the word-line driver clamps the word-line voltage to the low voltage.

Various word-line drivers are being used nowadays. However, the conventional word-line drivers are characterized by high stand-by power consumption and occupation of substantial silicon area.

SUMMARY

This summary is provided to introduce concepts related to a word-line driver for a memory, which are further described below in the detailed description. This summary is not intended to identify essential features of the claimed subject matter nor is it intended for use in determining or limiting the scope of the claimed subject matter.

In one embodiment, the memory includes a memory array having memory cells arranged in a plurality of rows. Each of the rows is controlled by a corresponding word-line and a plurality of word-line drivers. Each of the word-line drivers is configured to drive the corresponding word-line. Further, each word-line driver includes a first transistor, a second transistor, and a third transistor.

The first transistor includes a gate terminal driven by a first group selection signal, a first conduction terminal driven by a second sub-group selection signal, and a second conduction terminal coupled to the corresponding word-line. The second transistor includes a gate terminal driven by a second group selection signal, a second conduction terminal driven by the second sub-group selection signal, and a first conduction terminal driven coupled to the corresponding word-line. The third transistor includes a gate terminal driven by a third group selection signal, a first conduction terminal driven by a first sub-group selection signal, and a second conduction terminal coupled to the corresponding word-line.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of the illustration, elements in the figures are not necessarily to scale.

DETAILED DESCRIPTION OF PREFERRED EMBODIMENTS

The disclosed subject matter relates to a word-line driver for a memory. Typically, a core of a semiconductor memory comprises at least one two-dimensional memory cell array, where information can be stored. Traditionally, word-lines select rows, which activate cells, and bit-lines select columns, which access the cells for read or write operations. When a word-line and a bit-line are activated, a particular memory cell coupled to the two lines is selected.

To activate a word-line, its voltage is normally set to a high value, which is equal to a positive supply voltage in a CMOS circuitry. Setting word-line to a low value, such as a voltage complimentary to the positive supply voltage, de-activates the word-line. While the low voltage is customarily set to ground or 0V, the high voltage can be different for various semiconductor manufacturing technologies.

For instance, in a deep-sub-micron technology, a high voltage can be about 1.2V or below, while in a sub-micron technology the high voltage can be up to 2.5V. However, for a given memory chip and a given technology, particularly in case of complimentary-metal-oxide-semiconductor (CMOS) memory circuitry, the high voltage is normally a fixed value.

Further, the length of the word-lines varies depending on the technology and memory size. Accordingly, word-line drivers are implemented to drive longer word-lines that may otherwise load the memory. The word-line drivers are configured to select or unselect the word-lines based on a memory operation, such as memory read, memory program, and memory erase.

Also, with the development in manufacturing methods of non-volatile memories, the technological pitch, i.e., the minimum distance between two word-lines, is increasingly reduced. However, the conventional word-line drivers include at least four transistors, which occupy a substantial area on the memory. Additionally, such word-line drivers are associated with excessive switching. Because of the switching factor, the power consumption of the word-line driver also increases.

To this end, the present subject matter provides for a word-line driver that occupies less area, is power efficient, and is less complex in terms of voltage management due to reduction in a number of switching components and transient current. In one embodiment, the memory includes a memory array, an address decoder, a group decoder, and a plurality of sub-group decoders. The address decoder generates address selection signals. Based on the address selection signals, the group decoder and sub-group decoder generate group selection signals and sub-group selection signals, respectively. Such signals are fed to a word-line driver system having multiple word-line drivers. Each word-line driver is configured to drive a corresponding word-line. As mentioned before, the word-lines are coupled to one or more memory cells in the memory array. Based on the group selection signals and the sub-group selection signals, a word-line driver is selected. The selected word-line driver drives the corresponding word-line for one of memory read, memory program or memory erase operations.

In said embodiment, the word-line driver includes a first transistor, a second transistor, and a third transistor. All three transistors receive group selection signals from the group decoder, a first sub-group selection signal from a first sub-group decoder, and a second sub-group selection signal from a second sub-group decoder.

The signals received by the word-line driver (hereinafter referred to as word-line driver signals) may be of variable polarity, and vary according to the memory operations. The word-line driver signals may also vary based on whether a specific word-line driver is selected or not. The disclosed subject matter can be implemented in non-volatile memories, specifically flash memories supporting page erase architecture.

While aspects of described systems and methods for a word-line driver for a memory can be implemented in any number of different configurations, the embodiments are described in the context of the following exemplary system architecture(s). Additionally, the word "connected" is used throughout for clarity of the description and can include either a direct connection or an indirect connection.

The descriptions and details of well-known components are omitted for simplicity of the description. Although the elements are explained herein as certain p-channel and n-channel transistors, it can be appreciated that elements having similar functionalities may be implemented in accordance with the present subject matter. Additionally, the logic level of control signals can either be active low or active high. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

Figure 1:
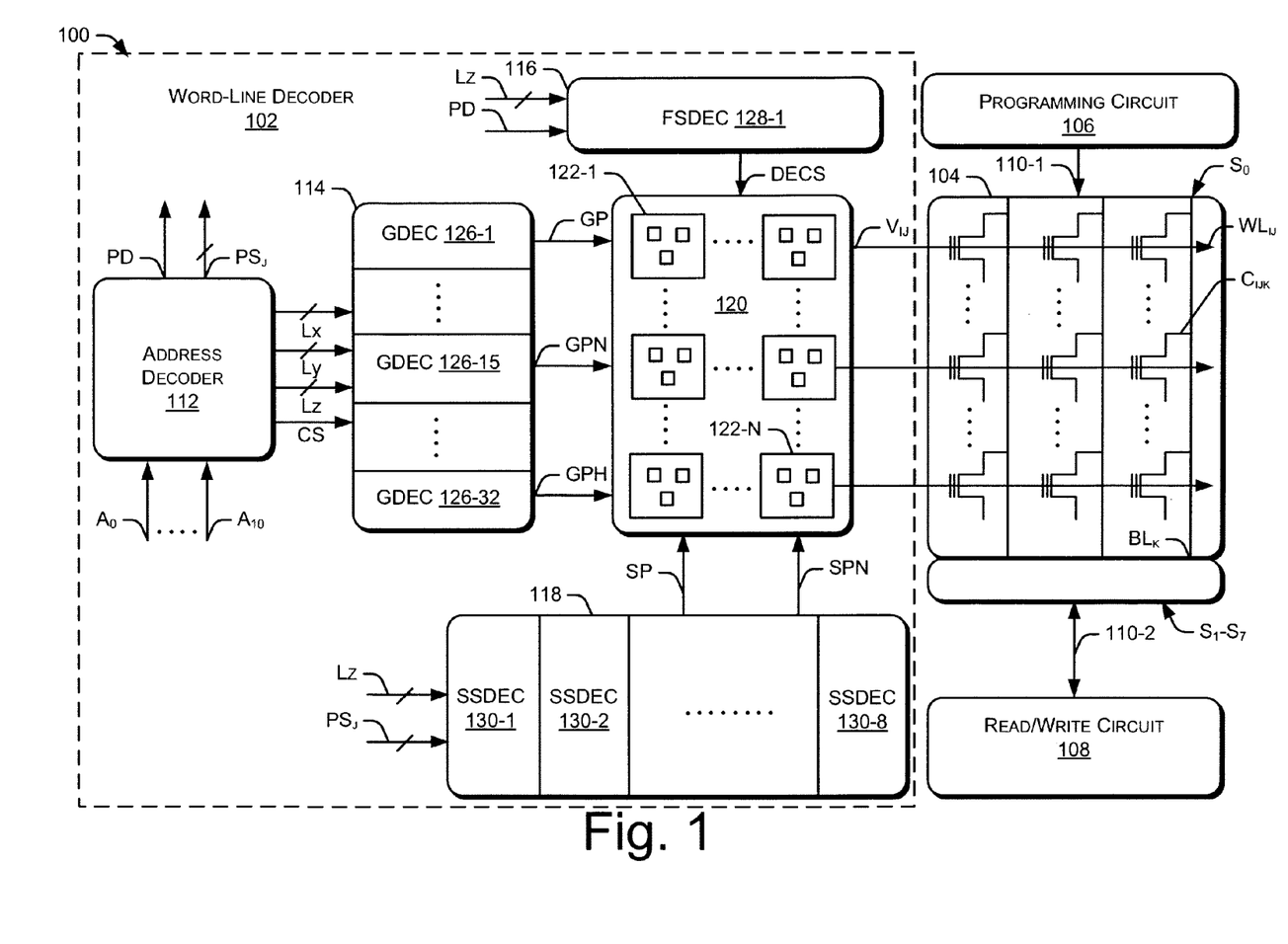
FIG. 1 illustrates an exemplary system embodying a word-line decoder, in accordance with an embodiment of the present subject matter.

FIG. 1 illustrates an exemplary system 100 for driving word-lines. In one example, the system 100 is a non-volatile memory like flash memory. The system 100 includes a word-line decoder 102 and a memory array 104. The operation and construction of the system 100 is described with reference to certain examples and illustrations and therefore, in no way, should be construed as limiting.

In the description to follow, the word-line decoder 102 receives an 11-bit word-line address (A0 to A10). Even though the following description is configured to receive an 11-bit address, it will be appreciated that the description may extend to various other configurations in accordance with the present subject matter. Accordingly, some variations may be possible with a change in the system configuration, as will be understood by a person skilled in the art.

In response to the 11-bit word-line address, the word-line decoder 102 is configured to generate signals to operate the memory array 104 in various modes of operation, such as memory program, memory erase, and memory read. One or more control signals CS provided by the word-line decoder 102 direct whether a data needs to be written onto, or read or erased from the memory array 104.

In one embodiment, the memory array 104 is divided into sectors S. It should be noted that the representation of the memory array 104 in the form of sectors S is only for the purpose of explanation, and thus should not be construed as limiting. For the ease of understanding, the memory array 104 is shown to be divided into at least eight sectors S0 to S7. Such a division is made based on the three most significant bits (A0 to A2) of the word-line address. Further, each sector S includes 256 word-lines WL.

Additionally, each sector S may be divided into groups G and sub-groups SG (not shown in the figure) of word-lines. Thus, a word-line belonging to a group of rank 'i' (Gi) and to a sub-group of rank T (SGj) is designated WLij. The next five most-significant bits (A3 to A7) are used to identify a group G of word-lines WL and the three least-significant bits (A8 to A10) are used to identify a sub-group SG of word-lines WL. In an example, each sector S includes 32 groups (G0 to G31) of 8 word-lines WL each and 8 sub-groups (SG0 to SG7) of 8 word-lines WL from different groups. Hence, the intersection of a group Gi of word-lines WL and of a sub-group SGj of word-lines WL corresponds to a single word-line WLij.

The memory array 104 also includes bit-lines BL. A bit-line BLk and a word-line WLij are coupled to a memory cell Cijk. Thus, the memory array 104 includes several memory cells C arranged in a matrix. In one implementation, the memory cells C are implemented using floating gate transistors, for example, n-channel floating gate transistors. As mentioned previously, a particular memory cell Cijk can be accessed based on a specified word-line WLij and a bit-line BLk. In said implementation, control gate of the memory cell Cijk is tied to its respective word-line WLij, while source or drain of the memory cell Cijk is coupled to its respective bit-line BLk. On activation of the word-line WLij and the bit-line BLk, the memory cell Cijk is selected for one of a memory read, memory program or memory erase operation.

The bit-line BLk are linked to a programming circuit 106 on one end and a read/program circuit 108 on the other end. The programming circuit 106 receives a data Din 110-1 and stores it in one or more selected memory cells Cijk during a program cycle, while the read/write circuit, for example, a sense amplifier, reads out a data Dout 110-2 during a read cycle.

In one embodiment, the word-line decoder 102 includes an address decoder 112; a group decoder 114; a plurality of sub-group decoders, namely a first sub-group decoder 116 and a second sub-group decoder 118; and a word-line driver system 120 having a plurality of word-line drivers 122-1, ..., 122-N, collectively referred to as word-line drivers 122. Typically, the number of word-line drivers 122 is equal to the number of word-lines WL.

The word-line decoder 102 also includes switch circuits (not shown in the figure), for generating bias signals required for the operation of the system 100. It should be noted that the elements shown within the word-line decoder 102 are for only one sector. Similar elements will be in place for other sectors, as will be understood by a person skilled in the art.

The address decoder 112 generates address selection signals, namely a first address selection signal Lx, a second address selection signal Ly, and a third address selection signal Lz, based on the word-line address. In an example, the three most significant bits (A0 to A2) of the word-line address help in generating the third address selection signal Lz. The first and second address selection signals Lx and Ly may vary according to the five most significant bits (A3 to A7), thus allowing 32 different combinations of the first and second address selection signals: Lx and Ly. It would be appreciated that other combinations would also be within the scope of the present subject matter.

The address decoder 112 also generates a plurality of sub-group decoder signals, namely, a first sub-group decoder signal PD and a second sub-group decoder signal PSj. For example, the sub-group decoder signals PD and PS1 are logic high for selecting the sub-group SG1. In one implementation, the address decoder 112 may also include a secondary logic unit (not shown in the figure) to provide the control signals CS to support a variety of operations, for example, erase, read, and program operations, select a value of supply voltage, etc. In another implementation, the secondary logic unit may be external to the address decoder 112.

In the example where each sector S has 256 word-lines WL, the group decoder 114 includes 32 group decode elements (GDEC), GDEC 126-1 to GDEC 126-32, collectively referred to as GDEC 126. Based on the combination of the address selection signals (Lx, Ly, and Lz), the address decoder 112 selects a GDEC, for example, GDEC 126-1. The selected GDEC 126-1 generates group selection signals, namely GP, GPN, GPNH, and GPH, having variable voltage values. In an implementation, the group selection signals are used to select a group of word-lines from amongst a plurality of groups. For the purpose, the group selection signals GP, GPH and GPN are fed to the word-line driver system 120.

In one embodiment, the first sub-group decoder 116 includes only one first sub-group decode element FSDEC 128-1, while the second sub-group decoder 120 includes eight second sub-group decode elements SSDEC 130-1 to SSDEC 130-8, collectively referred to as SSDEC 130. The FSDEC 128-1 receives the first sub-group decoder signal PD and the third address selection signal Lz. Accordingly, the FSDEC 128-1 generates a first sub-group selection signal DECS. Similarly, each SSDEC 130 receives the second sub-group decoder signal PSj and the third address selection signal Lz. Accordingly, one SSDEC 130 is activated to generate a second sub-group selection signal SP and a complement of the second sub-group selection signal SPN. For example, SSDEC 130-1 receives the second sub-group decoder signal PS0 and the third address selection signal Lz to generate the second sub-group selection signal SP and its complement SPN.

The first sub-group selection signal DECS and the second sub-group selection signal SP and its complement SPN are fed to the word-line driver system 120 along with the group selection signals GP, GPH, and GPN. Further, at least one word-line driver 122 is selected. In one embodiment, the selected word-line driver, for example, word-line driver 122-1 is used for selecting or de-selecting a corresponding word-line WLij, such as WL11 in the memory array 104. As mentioned before, the word-line WLij is tied to the gate terminal of the memory cell Cijk. The gate terminal of the memory cell Cijk has to be charged to different voltages during different operations of the memory.

To this end, the selected word-line driver 122-1 is used to provide the variable, operation-dependent voltages to the memory cell Cijk. The selected word-line driver 122-1 does so by combining the group selection signals (GP, GPH and GPN) and sub-group selection signals (SP and DECS) of variable polarities to obtain word-line voltages V11 of variable polarity. Further, the word-line voltages V11 are applied to the corresponding word-lines WL11, thereby selecting or de-selecting the desired word-lines for the various memory operations.

For example, based on the voltages of the group selection signals (GP, GPN, GPH), the sub-group selection signals (SP, DECS), and the control signals CS, the word-line driver 122-1 is selected. The selected word-line driver 122-1 selects its corresponding WL11 for memory erase, read or program operation, as defined by the CS.

In a memory read operation, the selected word-line(s) WL like WL11 is charged to a positive voltage and the un-selected word-lines are kept at a ground potential. Similarly, in a memory program operation, the WL11 is held at a high positive voltage and the un-selected word-lines are at the ground potential. Such voltages are rendered by the word-line driver 122.

Further, to perform a memory erase operation, the flash memory may support either sector erase or page erase. In case of sector erase, all the word-lines within a sector are provided with a negative voltage so as to erase all the contents stored in the entire sector. Whereas in case of the page erase, a user has the flexibility to erase contents stored in the memory cells controlled by a single word-line (or page). Therefore, in a page erase architecture, the selected word-line is held at a negative voltage, while the un-selected word-lines are kept at the ground potential. For the purpose of explanation, programmed memory cells have positive voltages, while erased cells have negative voltages.

The word-line driver 122 described herein is based on the page-erase architecture of a non-volatile memory, such as a flash memory. A person of ordinary skill in the art will appreciate that the principles disclosed herein apply both to single level flash memories (one bit per cell) and to multilevel flash memories (many bits per cell).

In said embodiment, the word-line driver 122 includes three transistors, for example, one p-channel transistor and two n-channel transistors. The design described herein provides an overall saving in silicon area and power consumption. Further, as technological pitch is reduced, it can be used for other elements instead. The construction and operation of the word-line driver 122 is explained further with reference to FIGS. 2 to 5.

Figure 2:
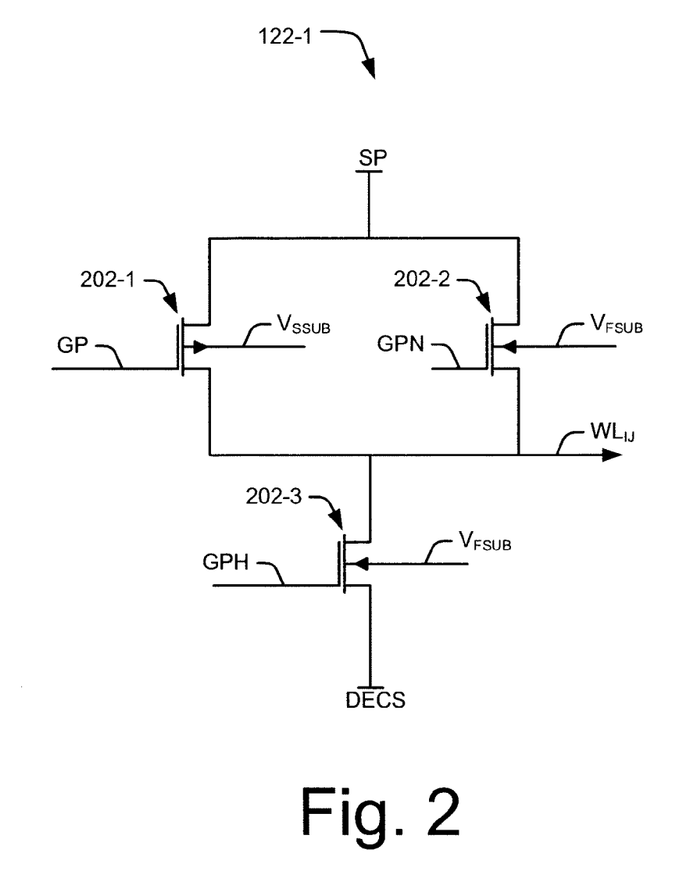
FIG. 2 illustrates an exemplary architecture of a word-line driver, in accordance with an embodiment of the present subject matter.
Figure 3:
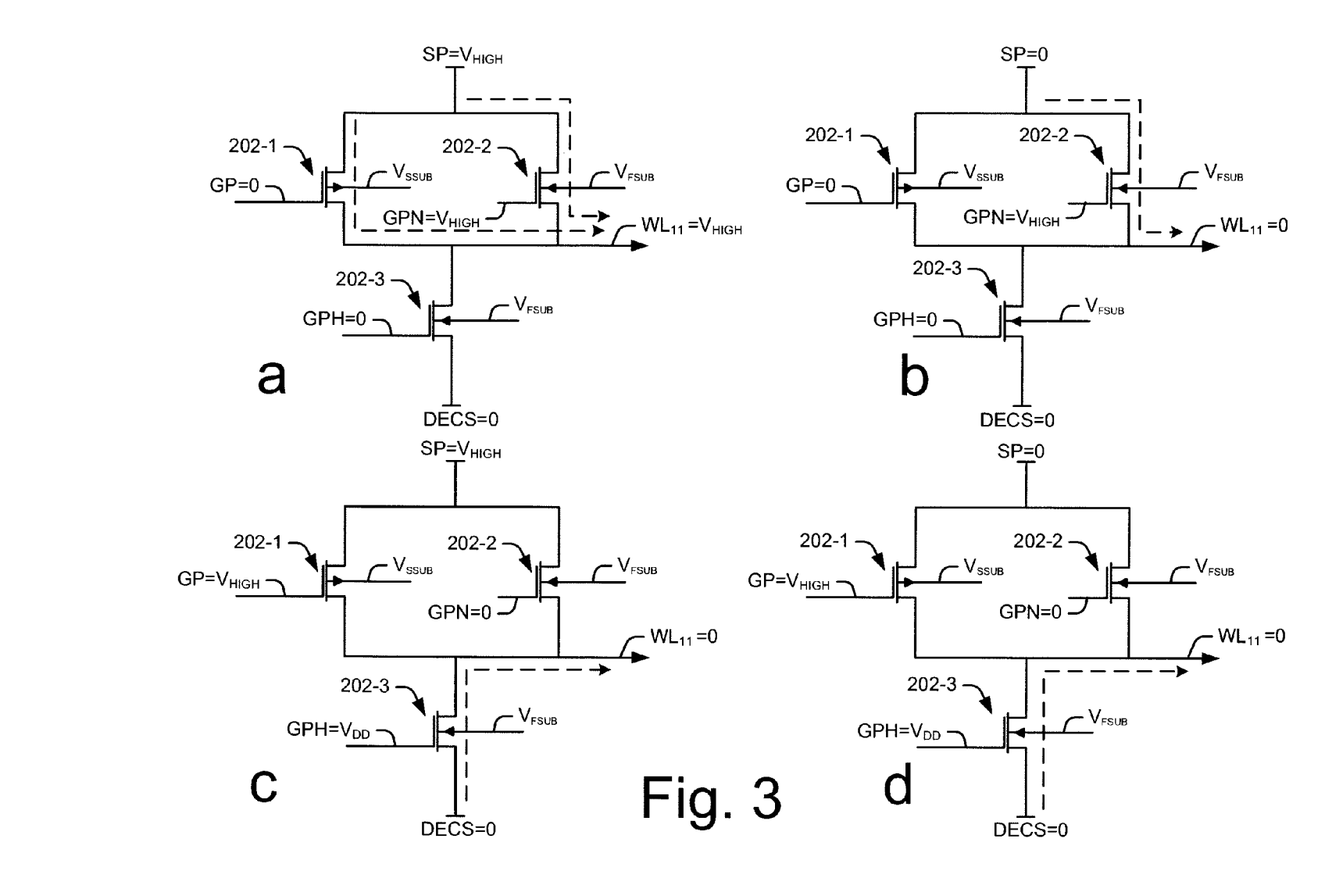
FIGS. 3a to 3d represent the word-line driver in various configurations of program/read operation, in accordance with an embodiment of the present subject matter.
Figure 4:
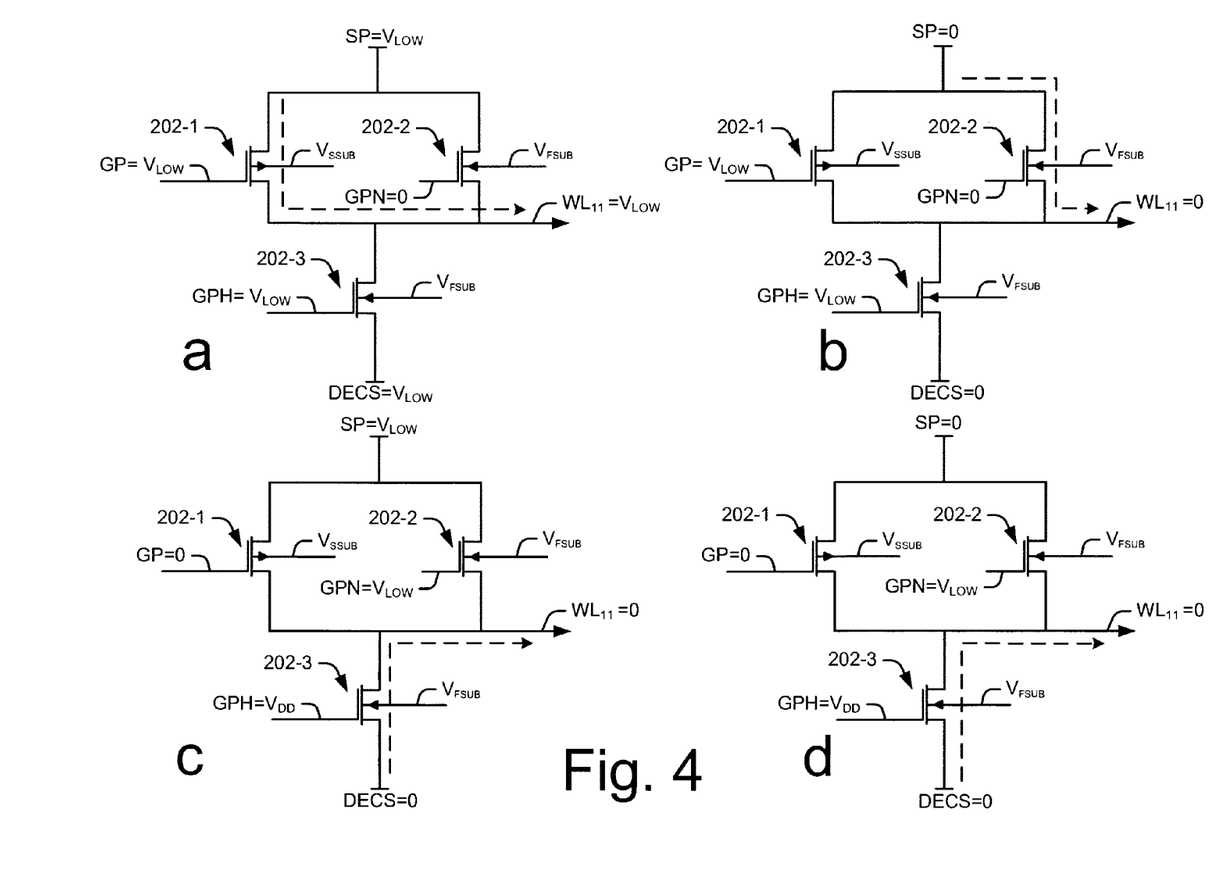
FIGS. 4a to 4d represent the word-line driver in various configurations of erase operation, in accordance with an embodiment of the present subject matter.
Figure 5:
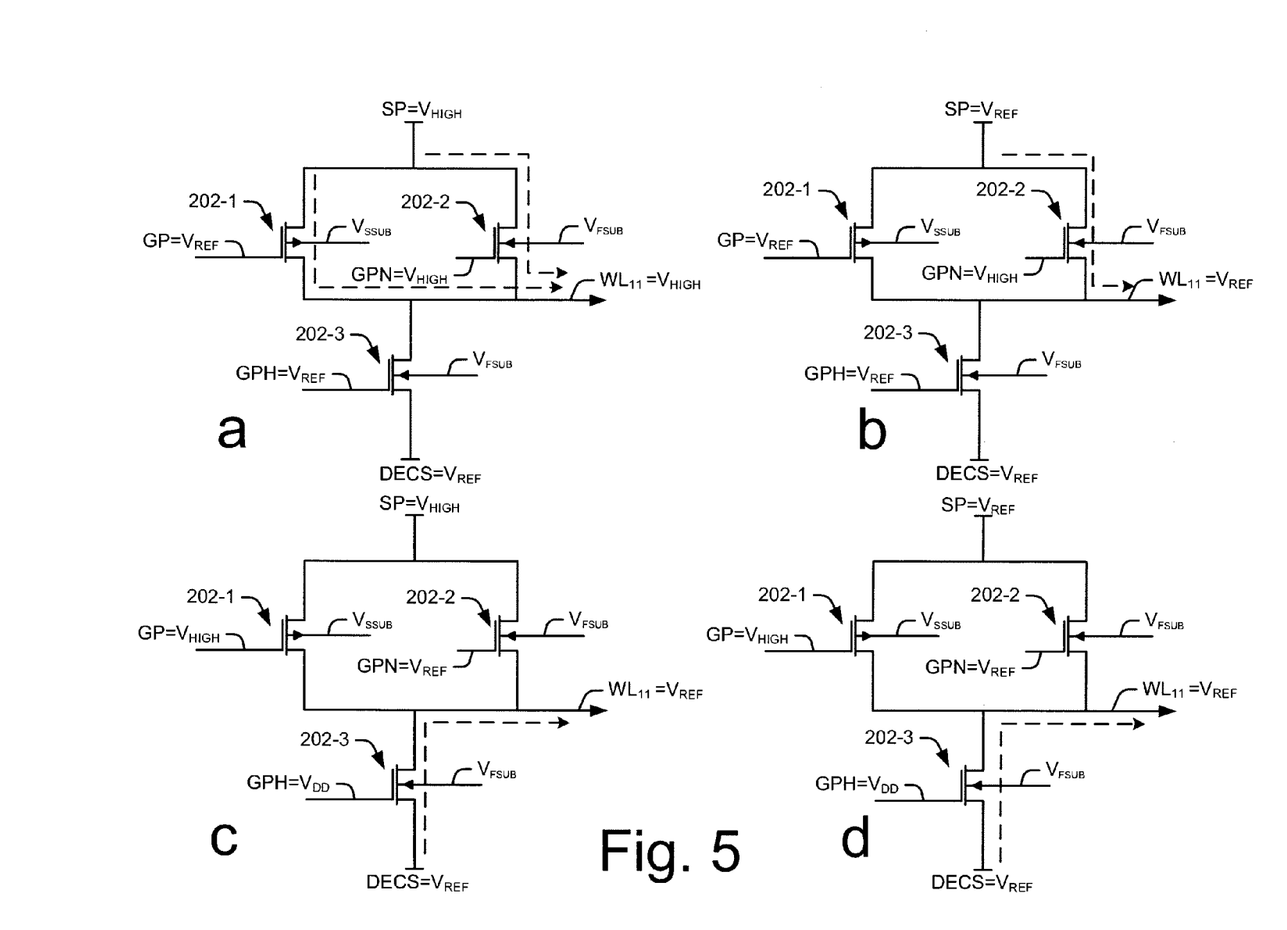
FIGS. 5a to 5d represent the word-line driver in various configurations of verify operation, in accordance with an embodiment of the present subject matter.

FIG. 2 represents a word-line driver 122-1 included within the word-line decoder 102 included in the memory. The word-line driver 122-1 drives a single word-line, for example, WL11 in the memory array 104. Thus, a total of 256 such word-line drivers can be implemented to drive a sector of 256 word-lines in the memory array 104. It will be apparent that the explanation provided herein is in context of the word-line driver 122-1, which drives the word line WL11; however, the explanation may be extended to other word-line drivers 122 included in the word-line driver system 120.

In one embodiment, the word-line driver 122-1 includes one p-channel first transistor (202-1) and two n-channel second and third transistors (202-2 and 202-3). The gate terminals of the transistors 202-1, 202-2, and 202-3 receive a first group selection signal GP, a second group selection signal GPN and a third group selection signal GPH respectively, from the group decoder 114. Other variations are also possible as will be understood by a person skilled in the art.

A first conduction terminal of the first transistor 202-1 and a second conduction terminal of the second transistor 202-2 receive the second sub-group selection signal SP from the second sub-group decoder 118, while a first conduction terminal of the third transistor 202-3 receives the first sub-group selection signal DECS from the first sub-group decoder 116.

In one embodiment, the first conduction terminal of a transistor is a source terminal and the second conduction terminal is a drain terminal. Bulk terminals of the second transistor 202-2 and the third transistor 202-3 are directly connected to a first bulk voltage VFSUB, and a bulk terminal of the first transistor 202-1 is directly connected to a second bulk voltage VSSUB. The first and the second bulk voltages VFSUB and VSSUB may be provided by the switch circuits.

The parallel combination of the first transistor 202-1 and the second transistor 202-2 is directly connected in series to the third transistor 202-3. A second conduction terminal of first transistor 202-1 and a first conduction terminal of the second transistor 202-2 are tied to the word-line WL11, where the word-line WL11 is configured to select or unselect a memory cell. Based on the selection, the corresponding bit line say bit-line BL1 is used to perform one of memory read, memory erase or memory program operations.

As mentioned before, the word-line driver 122-1 receives signals of variable voltages to either select or unselect a word-line for the purpose of memory read, memory erase or memory program operation. Table 1 depicts some of the various combinations of word-line driver signals, namely the sub-group selection signals (DECS, SP), and the group selection signals (GP, GPH, and GPN), for a memory program/read operation. In all possible combinations, the first sub-group selection signal DECS is stable and held at a predetermined voltage, for example, at ground voltage. As a result, only one FSDEC 128-1 may be used. The explanation of Table 1 is supported with FIGS. 3a to 3d.

TABLE 1

MEMORY PROGRAM/READ OPERATION

| Word-Line Selected | DECS | SP | GP | GPH | GPN | WL |
|---|---|---|---|---|---|---|
| Yes | 0 | VHIGH | 0 | 0 | VHIGH | VHIGH |
| No | 0 | 0 | 0 | 0 | VHIGH | 0 |
| No | 0 | VHIGH | VHIGH | VDD | 0 | 0 |
| No | 0 | 0 | VHIGH | VDD | 0 | 0 |

In one embodiment, to program or read at least one word-line, say WL11, the second group selection signal GPN and the second sub-group selection signal SP are both at positive voltages, VHIGH, while the first and the third group selection signals GP and GPH are at a ground potential "0". In said embodiment, positive voltage VHIGH is 8.5 Volts (V) for a memory program operation, while the positive voltage VHIGH is 4.5V for a memory read operation. As a result, the first transistor 202-1 is activated, i.e., put in an "ON" state and the word-line WL11 charges to the positive voltage VHIGH. Such a word-line is thus selected for the memory program/read operation. The voltage flow is illustrated in FIG. 3a.

Referring to FIG. 3b, the second sub-group selection signal SP, and the first and the third group selection signals GP and GPH are at ground level, while the second group selection signal GPN is at the positive voltage VHIGH. This means that the first transistor 202-1 and the third transistor 202-3 are in the "OFF" state, but the second transistor 202-2 is in the "ON" state. The word-line WL11 is discharged to ground potential. In this case, the word-line WL11 is unselected for the memory program operation.

The word-line WL11 is unselected for various other combinations of the word-line driver signals as well. For example, as shown in FIG. 3c, the second sub-group selection signal SP and the first group selection signal GP are at the positive voltage VHIGH, the second group selection signal GPN is kept at ground, and the third group selection signal GPH is kept at a bias voltage VDD. For example, the bias voltage VDD may be about 3.3V and may vary based on the technology. At such voltage levels, the first transistor 202-1 and the second transistor 202-2 are in the "OFF" state, and the transistor 202-3 is in the "ON" state. As a result, the word-line WL11 is discharged to the ground level through the third transistor 202-3.

Another case in which the word-line WL11 is unselected is elaborated in FIG. 3d. In this case, the second sub-group selection signal SP and the second group selection signal GPN are at the ground level, the first group selection signal GP is held at the positive voltage VHIGH, and the third group selection signal GPH is kept at the bias voltage VDD. WL11 discharges to the ground level through the third transistor 202-3.

As mentioned before, the word-line driver 122-1 supports page erase. To erase a page, i.e., to erase all the memory cells coupled to a single word-line, the word-line driver signals of variable polarity are provided to the word-line driver 122. The memory erase operation is illustrated with the help of table 2 in conjunction with FIGS. 4a to 4d.

It should be noted that a word-line selected for the memory erase operation is at a negative voltage, VLOW. In one implementation, the negative voltage VLOW is about −8.5V.

TABLE 2

MEMORY ERASE OPERATION

| Word-Line Selected | DECS | SP | GP | GPH | GPN | WL |
|---|---|---|---|---|---|---|
| Yes | VLOW | VLOW | VLOW | VLOW | 0 | VLOW |
| No | 0 | 0 | VLOW | VLOW | 0 | 0 |
| No | 0 | VLOW | 0 | VDD | VLOW | 0 |
| No | 0 | 0 | 0 | VDD | VLOW | 0 |

Referring to FIG. 4a, the second sub-group selection signal SP, the first and the third group selection signals GP and GPH are at the negative voltage VLOW, and the second group selection signal GPN is held at the ground level. In addition, the first sub-group selection signal DECS is kept at the negative voltage VLOW for the memory erase operation. The word-line driver signals at such voltage levels activate the transistors 202-1 and 202-2 and de-activate the transistor 202-3. As a result, the selected word-line WL11 discharges to the negative voltage, VLOW, as illustrated by the voltage flow. For all other combinations of the word-line driver signals, such as the group selection signals GP, GPH, GPN and the sub-group selection signals SP and DECS, the word-line driver 122-1 is unselected. For example, consider a case when the second sub-group selection signal SP and the second group selection signal GPN are at the ground level, and the first and the third group selection signals GP and GPH are at the negative voltage VLOW. Due to the application of such voltages, the word-line driver 122 sets the word-line WL11 to a ground potential, thereby rendering the word-line WL11 as unselected, as shown in FIG. 4b.

With reference to FIGS. 4c and 4d, the word-line WL11 is unselected when both the transistors 202-1 and 202-2 are switched off and the third transistor 202-3 is switched on. As a result, the word-line WL11 is discharged to the ground level.

Besides the memory read, program, and erase operations, the word-line driver 122-1 is also configured to support a verify operation. The program and erase verify operations include operations to confirm that a state of a memory cell Cijk, after programming or erasing, exists for a predetermined time interval. In particular, in a non-volatile memory, it is desired to control the state after writing or erasing with high precision. Therefore, such a verify operation is generally performed. Conventionally, in the verify programming/erasing operation, an operation is performed for a certain period followed by a reading period, confirming that the state after programming/erasing exists within a pre-determined range.

In one embodiment, the erase verify operation is illustrated herein. The following description is with reference to the verify erase operation; however, it will be understood that the description can be easily extended to program verify operation. As illustrated in FIGS. 5a to 5d and table 3, the un-selected word-line WL11 is kept at a verify voltage, VREF, in order to completely switch off the memory cells Cijk on the un-selected word-lines WL. In one implementation, the verify voltage VREF is about −2V. The first sub-group selection signal DECS is also kept stable, for example, at the verify voltage VREF. In an example, the verify voltage VREF values may range from about −1.2V to about −3.5V.

TABLE 3

MEMORY ERASE VERIFY OPERATION

| Word-Line Selected | DECS | SP | GP | GPH | GPN | WL |
|---|---|---|---|---|---|---|
| Yes | VREF | VHIGH | VREF | VREF | VHIGH | VHIGH |
| No | VREF | VREF | VREF | VREF | VHIGH | VREF |
| No | VREF | VHIGH | VHIGH | VDD | VREF | VREF |
| No | VREF | VREF | VHIGH | VDD | VREF | VREF |

Referring to FIG. 5a, the word-line WL11 is selected when the second sub-group selection signal SP and the second group selection signal GPN are at the positive voltage VHIGH say at about 4.5V, and the first and the third group selection signals GP and GPH are kept at the verify voltage VREF. Such a combination of voltage signals activates the first transistors 202-1 and the second transistor 202-2 and the word-line WL11 is charged to the positive voltage VHIGH. For all other combinations of the word-line driver signals, the word-line WL11 is at the verify voltage VREF.

Figure 6:
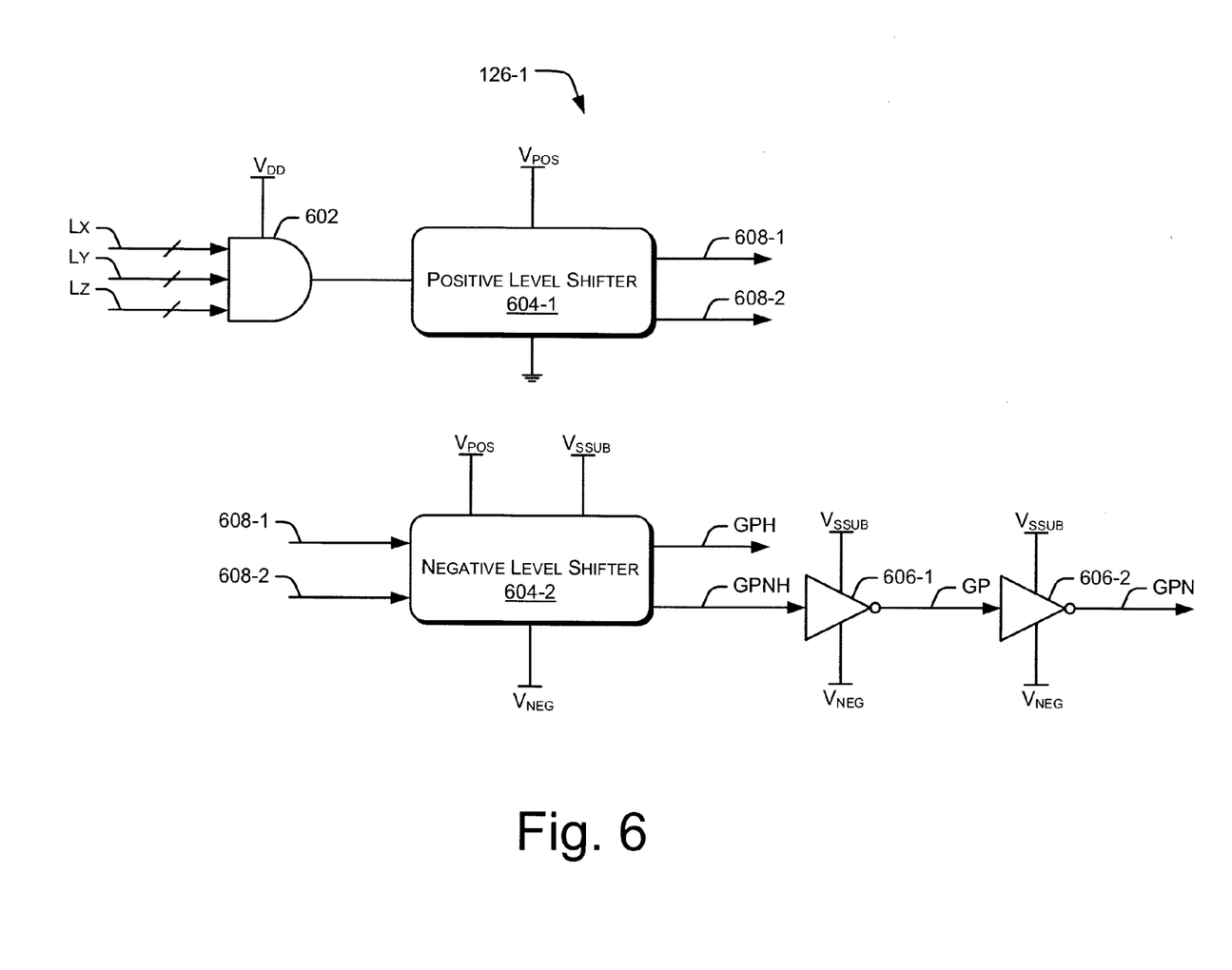
FIG. 6 illustrates an exemplary circuit configuration of a group decode element included in a group decoder, in accordance with an embodiment of the present subject matter.

FIG. 6 illustrates a circuit configuration of a GDEC 126-1 included in the group decoder 114, in accordance with an embodiment of the present subject matter. As mentioned before, based on the address selection signals, a GDEC from amongst GDEC 126 is selected. The selected GDEC, for example GDEC 126-1, generates group selection signals such as GP, GPN, GPH, and GPNH. Even though the description hereinafter is in terms of GDEC 126-1, it will be understood that the description may be extended to other GDECs 126.

The selected GDEC 126-1, includes an AND gate 602, two level shifters, such as a positive level shifter 604-1 and a negative level shifter 604-2, and two inverters 606-1 and 606-2. The AND gate 602, powered by the bias voltage VDD, receives the address selection signals (Lx, Ly and Lz) as inputs. An output of the AND gate 602 is applied to the positive level shifter 604-1. The positive level shifter 604-1, supplied with a level shifter voltage VPOS, generates two intermediate signals 608-1 and 608-2. For example, if an input to the positive level shifter 604-1 is logic high, the intermediate signals 608-1 and 608-2 are logic low and logic high, respectively. In said implementation, the level shifter voltage VPOS is the most positive voltage in the system 100 and may vary according to the technology. Further, the level shifter voltage VPOS may be used to generate other voltages in the system 100. As an example, the level shifter voltage VPOS is about 8.8V.

The intermediate signals 608-1 and 608-2 are provided as inputs to the negative level shifter 604-2. The negative level shifter 604-2 is supplied with the level shifter voltage VPOS, the second bulk voltage VSSUB, and another level shifter voltage VNEG (where VNEG is the complement of the level shifter voltage VPOS). Based on the intermediate signals 608-1 and 608-2, the negative level shifter 604-2 generates the first group selection signal GPH and its complement GPNH. The complementary signal GPNH is fed to the inverter 606-1 to provide the first group selection signal GP. Further the first group selection signal GP is fed to the second inverter 606-2 to generate the second group selection signal GPN. In one implementation, the GPN swings from 0 to about another level shifter voltage VNEG while GPNH swings between the bias voltage VDD and another level shifter voltage VNEG. Both the inverters 606-1 and 606-2 are powered by the second bulk voltage VSSUB and the other level shifter voltage VNEG.

The value of the group selection signals GP, GPN and GPH is, therefore, dependent on the address selection signals. Further, the value of the group selection signals may be the level shifter voltages VPOS, or VNEG or the second bulk voltage VSSUB. In terms of layout, the circuitry of the GDEC 126-1 can be repeated for 32 times as 32 GDEC 126 are included in the group decoder 114.

Figure 7:
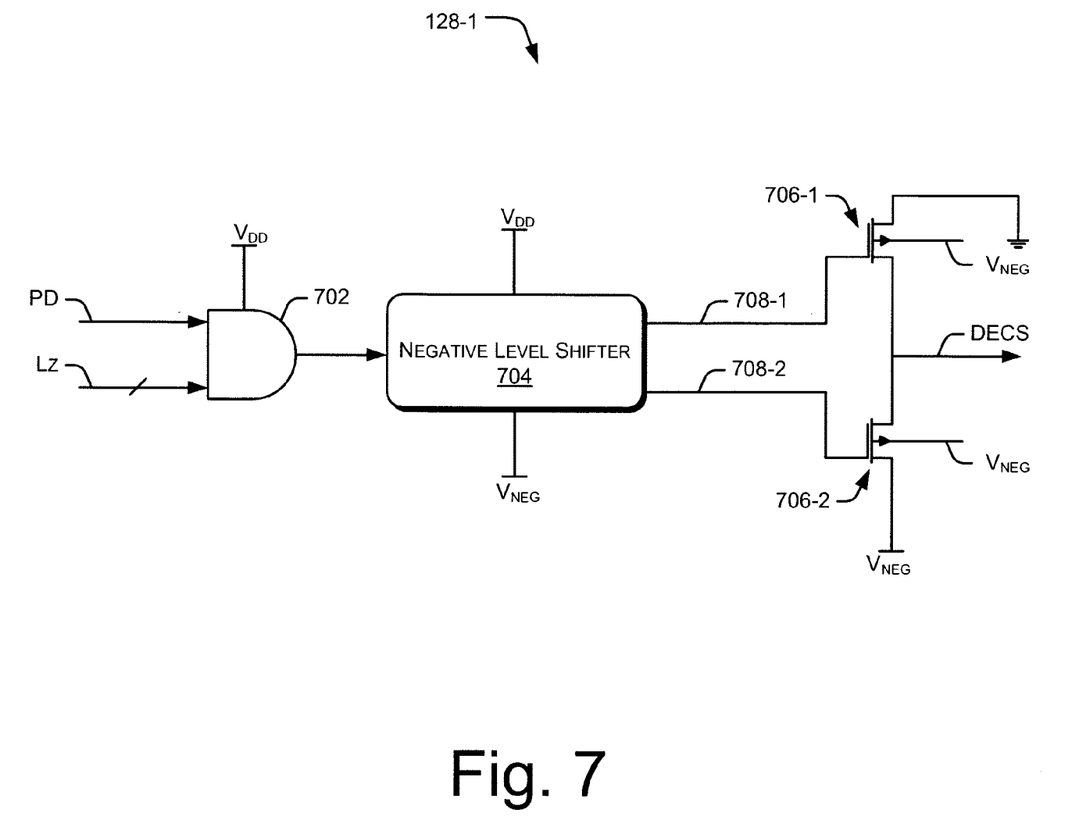
FIG. 7 illustrates an exemplary circuit configuration of a first sub-group decode element included in a first sub-group decoder, in accordance with an embodiment of the present subject matter.

FIG. 7 illustrates the circuit configuration of the FSDEC 128-1 included in the first sub-group decoder 116. In one embodiment, only one first sub-group decode element, FSDEC 128-1, is present within the first sub-group decoder 116. The FSDEC 128-1 includes an AND gate 702, a negative level shifter 704, and two n-channel transistors 706-1 and 706-2. The AND gate 702 receives the first sub-group decoder signal PD and the third address selection signal Lz.

The output of the AND gate 702 is fed to the negative level shifter 704 supplied with the bias voltage VDD and the other level shifter voltage VNEG. The negative level shifter 704 generates two intermediate signals 708-1 and 708-2. The intermediate signals 708-1 and 708-2 are fed to the gate terminals of the series-connected transistors 706-1 and 706-2, respectively. Bulk terminals of both the transistors 706-1 and 706-2 are coupled to the other level shifter voltage VNEG. The first sub-group selection signal, DECS, obtained from a second conduction terminal of the transistor 706-1, is provided to the word-line drivers 122. It should be noted that in the embodiment described herein, one first sub-group selection signal DECS is obtained, which is fed to all the word-line drivers 122. Conventionally, a plurality of first sub-group decode elements FSDEC 128 are implemented depending on a density of the memory array 104 and sectors S therein. As the number of first sub-group decode elements FSDEC 128 increases, management of switching in first sub-group selection signal DECS becomes increasingly complex. The present subject matter provides for a common first sub-group selection signal DECS, which is common for one sector, thus substantially reducing the switching of the first sub-group selection signal and transient current.

Figure 8:
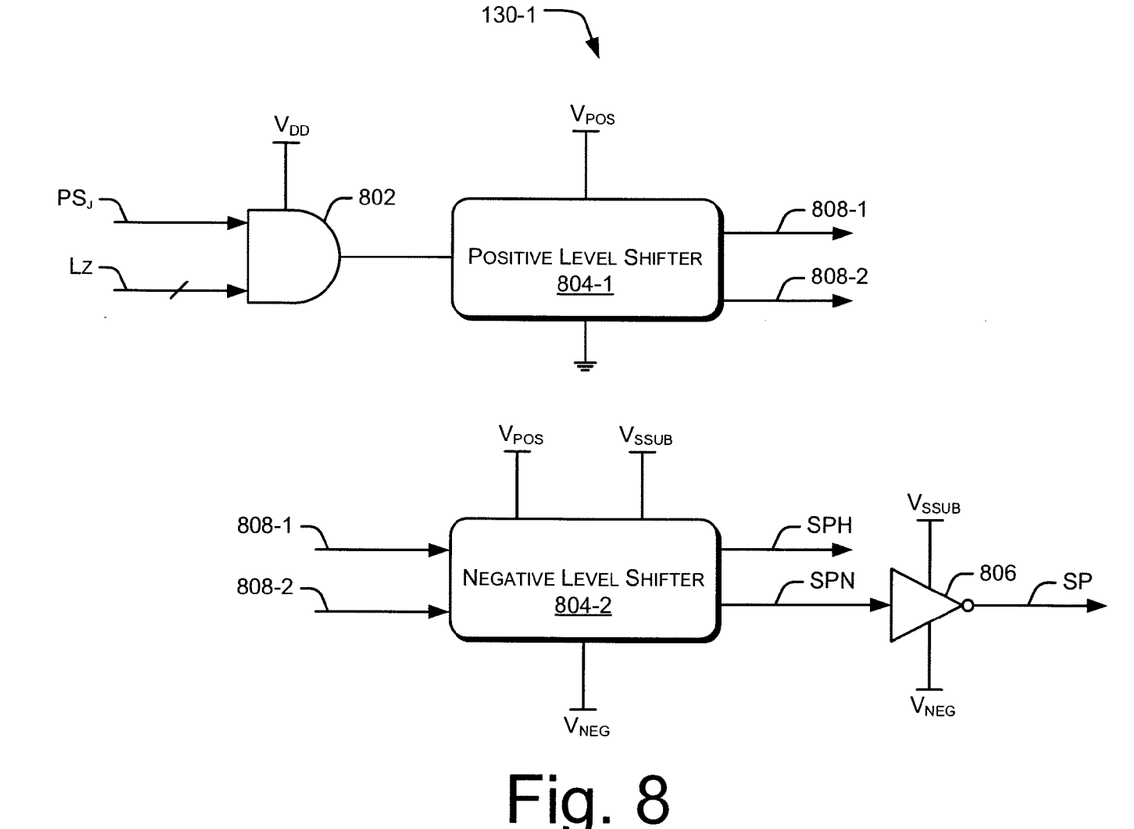
FIG. 8 illustrates an exemplary architecture of a second sub-group decode element included in the second sub-group decoder, in accordance with an embodiment of the present subject matter.

FIG. 8 illustrates an exemplary structure of the SSDEC 130-1 included in the second sub-group decoder 118. As mentioned previously, the second sub-group decoder 118 includes eight SSDECs 130-1, . . . , 130-8, and each of the SSDEC 130 receives the second sub-group decoder signal PSj and the third address selection signal Lz. Accordingly, a sub-group decode element can be selected for memory operations. The selected SSDEC, for example, SSDEC 130-1, generates the second sub-group selection signal SP and its complement SPN.

In one embodiment, each SSDEC, for example SSDEC 130-1, includes an AND gate 802, at least two level shifters, i.e., a positive level shifter 804-1 and a negative level shifter 804-2, and an inverter 806. The AND gate 802, which is powered by the bias voltage VDD, receives the sub-group decoder signal PS1 and the third address selection signal Lz. An output of the AND gate 802 is fed to the positive level shifter 804-1 powered by the level shifter voltage VPOS.

The positive level shifter 804-1 generates two intermediate signals 808-1 and 808-2. The intermediate signals 808-1 and 808-2 are fed to the negative level shifter 804-2, which in turn generates two other signals SPH and SPN. The signal SPN is fed to the inverter 806, which is supplied with the second bulk voltage VSSUB and the other level shifter voltage VNEG, to provide the second sub-group selection signal SP. The second sub-group selection signal SP is fed to the word-line drivers 122.

Although embodiments for a word-line driver of a memory have been described in language specific to structural features and/or methods, it is to be understood that the invention is not necessarily limited to the specific features or methods described. Rather, specific features and methods are disclosed as exemplary embodiments for the word-line driver.

I claim:

1. A word-line driver comprising:
a first transistor having a gate terminal driven by a first group selection signal, a first conduction terminal driven by a second sub-group selection signal, and a second conduction terminal coupled to a word-line;
a second transistor having a gate terminal driven by a second group selection signal, a second conduction terminal driven by the second sub-group selection signal, and a first conduction terminal coupled to the word-line; and
a third transistor having a gate terminal driven by a third group selection signal, a first conduction terminal driven by a first sub-group selection signal, and a second conduction terminal coupled to the word-line,
wherein the word-line driver is configured to select the word-line for a memory erase operation when the first group selection signal, the third group selection signal, the first sub-group selection signal, and the second sub-group selection signal are at a negative voltage, and the second group selection signal is at a zero voltage.

2. The word-line driver as claimed in claim 1, wherein the word-line driver is configured to select the word-line for a memory program operation and a memory read operation when the second group selection signal and the second sub-group selection signal are at a positive voltage, and the first group selection signal, the third group selection signal and the first sub-group selection signal are at a zero voltage.

3. The word-line driver as claimed in claim 1, wherein the word-line driver is configured to perform a page erase operation.

4. The word-line driver as claimed in claim 1, wherein the first transistor comprises a p-channel transistor.

5. The word-line driver as claimed in claim 1, wherein the second and third transistors each comprise an n-channel transistor.

6. A method of driving a word-line comprising:
providing first, second, and third transistors;
driving a gate terminal of the first transistor by a first group selection signal, driving a first conduction terminal of the first transistor by the second sub-group selection signal, and coupling a second conduction terminal of the first transistor to a word-line;
driving a gate terminal of the second transistor by a second group selection signal, driving a second conduction terminal of the second transistor by the second sub-group selection signal, and coupling a first conduction terminal to the word-line;
driving a gate terminal of the third transistor by a third group selection signal, driving a first conduction terminal of the third transistor by a first sub-group selection signal, and a second conduction terminal coupled to the word-line; and
selecting the word-line for a memory erase operation when the first group selection signal, the third group selection signal, the first sub-group selection signal, and the second sub-group selection signal are at a negative voltage, and the second group selection signal is at a zero voltage.

7. The method as claimed in claim 6, further comprising selecting the word-line for a memory program operation and a memory read operation when the second group selection signal and the second sub-group selection signal are at a positive voltage, and the first group selection signal, the third group selection signal and the first sub-group selection signal are at a zero voltage.

8. The method as claimed in claim 6, further comprising a page erase operation.

9. The method as claimed in claim 6, wherein the first transistor comprises a p-channel transistor.

10. The method as claimed in claim 6, wherein the second and third transistors each comprise an n-channel transistor.

* * * * *